US008836342B2

(12) United States Patent
Hein

(10) Patent No.: US 8,836,342 B2
(45) Date of Patent: Sep. 16, 2014

(54) TEST STRUCTURE FOR HIGHLY ACCELERATED ELECTROMIGRATION TESTS FOR THICK METALLIZATION SYSTEMS OF SOLID STATE INTEGRATED CIRCUITS

(75) Inventor: Verena Hein, Linderbach (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 1347 days.

(21) Appl. No.: 12/446,483

(22) PCT Filed: Oct. 19, 2007

(86) PCT No.: PCT/EP2007/061246
§ 371 (c)(1),
(2), (4) Date: Nov. 5, 2010

(87) PCT Pub. No.: WO2008/046925
PCT Pub. Date: Apr. 24, 2008

(65) Prior Publication Data
US 2011/0037477 A1    Feb. 17, 2011

(30) Foreign Application Priority Data
Oct. 21, 2006   (DE) .......................... 10 2006 049 791

(51) Int. Cl.
G01N 27/62       (2006.01)
H01L 21/66       (2006.01)
G01R 31/28       (2006.01)

(52) U.S. Cl.
CPC .......... *G01R 31/2858* (2013.01); *H01L 22/34* (2013.01); *G01R 31/2884* (2013.01)
USPC ................. 324/459; 324/750.01; 324/762.01; 438/14; 257/48

(58) Field of Classification Search
USPC ............. 438/14; 257/48; 324/750.01, 762.01, 324/459
See application file for complete search history.

(56) References Cited

U.S. PATENT DOCUMENTS

| 5,448,179 | A | * | 9/1995 | Burns ............................ 438/17 |
| 5,712,510 | A | | 1/1998 | Bui et al. |
| 5,900,735 | A | | 5/1999 | Yamamoto |
| 6,191,481 | B1 | * | 2/2001 | Bothra et al. ................ 257/767 |

(Continued)

FOREIGN PATENT DOCUMENTS

| DE | 19710471 A1 | 5/1998 |
| DE | 10108915 A1 | 9/2002 |
| DE | 10211569 A1 | 10/2003 |
| EP | 0448273 A1 | 9/1991 |

OTHER PUBLICATIONS

Estabil, J.J. et al.; The Effect of Metal Thickness on Electromigration-Induced Extrusion Shorts in Submicron Technology; IEEE Reliability Physics Symposium; Apr. 9-11, 1991; pp. 57-63; 29th Annual Proceedings.

(Continued)

*Primary Examiner* — Huy Q Phan
*Assistant Examiner* — Temilade S Rhodes-Vivour
(74) *Attorney, Agent, or Firm* — Stevens & Showalter, L.L.P.

(57) ABSTRACT

A test structure and a process for the electromigration test of integrated circuits is suggested, in which metallization planes consisting of strip conductors of a usual thickness (11) are connected with metallization planes consisting of substantially thicker strip conductors (12) as they are required for the connection of components of higher performance.

23 Claims, 6 Drawing Sheets

(56) References Cited

U.S. PATENT DOCUMENTS

| | | |
|---|---|---|
| 6,282,679 B1 | 8/2001 | Lee |
| 6,320,391 B1 | 11/2001 | Bui |
| 6,680,484 B1 * | 1/2004 | Young ............................ 257/48 |
| 6,714,037 B1 * | 3/2004 | Hau-Riege et al. ...... 324/750.03 |
| 6,822,437 B1 | 11/2004 | Hau-Riege et al. |
| 6,835,578 B1 | 12/2004 | Lin et al. |
| 6,867,056 B1 * | 3/2005 | Hau-Riege et al. ............. 438/17 |
| 7,301,239 B2 * | 11/2007 | Wang et al. .................... 257/767 |
| 7,888,672 B2 * | 2/2011 | Fischer et al. ................... 257/48 |
| 8,237,458 B2 * | 8/2012 | Federspiel .................. 324/713 |
| 8,633,482 B2 * | 1/2014 | Walter et al. .................... 257/48 |
| 2004/0026693 A1 | 2/2004 | McLaughlin et al. |
| 2004/0058524 A1 | 3/2004 | Nakamura |

OTHER PUBLICATIONS

Jedec; Standard Test Structures for Reliability Assessment of AlCu Metallizations with Barrier Materials; JEDEC Standard; No. 87; Jul. 2001; pp. 1-10.

Lyons, Christopher; International Search Report for PCT/EP2007/061246; Mar. 27, 2008.

* cited by examiner

TEST STRUCTURE FOR HIGHLY ACCELERATED ELECTROMIGRATION TESTS FOR THICK METALLIZATION SYSTEMS OF SOLID STATE INTEGRATED CIRCUITS

FIELD OF THE INVENTION

The invention relates to a test structure for examining the electromigration behavior of integrated circuits with a thin metallization system and a thick metallization system formed thereon and a process for the production or the operation of the test structure.

BACKGROUND OF THE INVENTION

The service life of an integrated electronic circuit is may be determined by the reliability of the metal strip conductors of the entire metallization systems. Failures are mainly caused by electromigration during long-term operation, which result in a loss of cross-section of the strip conductor and, connected therewith, in an increase in the resistance of the same and, finally, in its burning out. Electromigration describes the effect of the migration of material in a conductor upon the occurrence of high current densities. A pulse transmission to ions in the conductor results in the case of very high current densities due to the directed movement of electrons, which, in the case of high current densities, may result in a "diffusion" of the ions and thus in a directed migration of material. Due to this, a loss of material is possibly caused on specific areas of the conductor, whereas at other points located downstream an accumulation of material may take place. Due to this, changed conditions for the current conduction result, which may result in a loss of power and, finally, in the complete failure of the metallization system and thus of the component. The current densities already occurring in integrated circuits during normal operation are relatively high, for instance a few kA per $cm^2$ so that, in the case of a longer duration of operation of the components, the changes due to the electromigration must already be taken into consideration in the specification of the components in order to be able to indicate a guaranteed service life with a specified power behavior.

In order to determine and to control the reliability of metallization systems of microelectronic integrated circuits, accelerated tests with test structures especially provided for this purpose are carried out. A metallization test structure is heated for this and/or a current is passed through a test strip conductor of a specific length. Here, the current density is substantially higher than the current density permitted as a maximum during normal operation. E.g. the time is measured after which the measuring circuit leading across the test strip conductor to be tested is interrupted and/or an increase in resistance by a specific factor results.

As a rule, the metal strip conductors consist of thin, approx. 400 nm to 1000 nm thick metal layers. However, there are cases where substantially thicker metal strips, i.e. with a thickness being 2 to 5 times thicker, are required for the conducting of higher currents (current densities) in connection with the integration of power components. If several metallization planes are present, there are pads and/or electric junctions (vias), at which the strip conductors of metallization planes that are coated thereon, i.e. that are located thereon, are electrically connected in a vertical direction e.g. by means of truncated metal pieces (plugs) which are e.g. formed from aluminum or tungsten. These are also points at which special failures occur due to migration effects. This is a customary failure picture in the case of a connection of customary thin metal layers with thick metal conductor strips. AlCu and AlSiCu, copper, copper alloys, silver, etc. come e.g. into question as the metal for the conductor strips. The test structures are located on the process wafers and can be individually subjected to specific tests as wafer composites or separately and in housings provided with a cap.

Quite a number of electromigration test structures for the customary metallization systems (thin metal strip conductors) are known, e.g. from the JEDEC Standard No. 87, US-A 2004 026693 or DE 197 10 471 (Mitsubishi) or U.S. Pat. No. 5,712,510 (AMD) show other electromigration test structures.

The known test structures are not suited for testing the strip conductor systems with thick metal and the junctions from a thin to thick metallization system. There are several reasons for this. On the one hand, the test structures must be made in such a way that they are in conformity with the design rules for the production of integrated circuits, especially the metallization systems in order to detect failure mechanisms being as realistic as possible with the tests. I.e. the structural elements forming the test structure must correspond to the structural elements of the actual integrated circuit as regards their geometry and composition of material in order to be able to quantitatively determine the migration behavior of these actual structural elements on the basis of the measuring results of the test structure. If different widths for the conductors are e.g. used in the test structure and the actual metallization plane, the complex conditions are very different in the migration of material and, as a rule, the statements obtained therewith cannot be transferred to other conditions. Also, different geometrical ratios may result in different conditions in the production of the structural elements, whereby, in turn, other material properties, e.g. a different crystal structure, etc. may be caused.

The inner crystal structure of the metal strips which is connected with the type of production of the metal layers causes that a mere increase in the dimensions of known test structures changes the conditions in such a way that they are no longer representative of the material to be tested. The migration occurs at points of the test structure which are not intended for testing, due to which the implementation of the test is impossible.

If a junction area from a thin metal system to a thick system being located thereon—a realistic case—is concerned and if, apart from the thin strip conductor, the vertical connections and/or junctions (so-called vias) are also to be tested with respect to reliability, the current would be supplied via a piece of the lower thin strip conductor, which would be unproblematic in the case of customary amperages occurring during normal operation, however, in the case of an accelerated test, results in that, in this test, the width of the piece would have to be enlarged observing the customary dimensions in order to be able to transport the higher current for the test of the thick strip conductor without said piece being destroyed by overheating.

However, such thin metal strips as they are found in known test structures already have per se a grain structure that is unfavorable for electromigration effects, wherein the grains have a "diameter" that is substantially smaller than the width of the strip conductor, due to which there are many triple points (points, where three grain boundaries adjoin) at which electromigration especially attacks, since, as already mentioned, the migration of material must be understood as a directed diffusion so that the grain boundaries may act as preferred diffusion paths. If now such a path for the supply of the higher current for the testing of the junction area to the thick metal and for the test stretch of the thick metal conductor strip is widened, the situation regarding the electromigration is still aggravated, since more diffusion paths are created and a premature failure occurs just at a point which is not provided for the test, at all. This could e.g. result in an incorrectly ascertained service life for the actual test conductor strip so that, all in all, an incorrect specification for the inspected component could result. Thus, such a test structure does not detect the failure mechanism due to the high amperage or current density for the junction of thin to thick and the thick strip conductor.

The test current is typically a d-c current. If it flows through a test strip conductor piece with a diameter of equal size and a specific length, then a defective point such as a depletion of conductive material will occur in the case of an increase in the current density due to electromigration in a critical area after a specific period of time, which results in an increase in resistance or a failure of current conduction, which can be locally observed. The location depends on the current direction and the interaction of the various migration mechanisms, i.e. the location of the point on the strip conductor piece is not located in the center of the strip conductor under normal conditions, but is displaced in the direction of the electron movement with respect to the center. In the case of the pole reversal of the current direction the defective point would have to occur symmetrically towards the center of the strip conductor under the same conditions. If this is not the case further conclusion to the failure mechanism can be drawn herefrom.

SUMMARY OF THE INVENTION

It is the object of the invention to indicate a test structure for the thick layer metal conductor strips and their vertical junctions from or to metallization system located below them with thin metal paths and to ensure a low susceptibility to failure regarding the failure on elements that are not to be tested.

According to a first aspect of the invention this object is attained by a test structure which is formed for the accelerated electromigration test for thick metal strip conductors and for electric junctions between a thin metallization system of a solid state integrated circuit and a thick metallization system of a solid state integrated circuit disposed thereon. Here, the metal thickness in the thick metallization system is at least two times the metal thickness in the thin metallization system. The test structure comprises a first connecting island and a second connecting island in the thick metallization system and a first and a second conduction piece which are disposed in the thin metallization system. Moreover, the test structure comprises a first power lead for connecting the first connecting island with the first conductor piece and a second power lead for connecting the second connecting island with the second connector piece. Moreover, a test strip conductor is provided in the thick metallization system and a first electric junction for connecting the first conductor piece with the test strip conductor and a second electric junction for connecting the second conductor piece with the test strip conductor are provided, wherein at least the first and the second conductor pieces are designed such that they substantially do not exhibit any migration of material caused by current in the case of a specified current density for testing the first and the second electric junction and the test strip conductor.

The amperage required for a highly accelerated electromigration test can be supplied via the conductor pieces in the thin metallization system by means of this test structure according to the invention without the occurrence of electromigration effects caused by the high current density at that part. Thus, the changes in resistance in the remaining test structure can be allocated to corresponding migrations of material in the electric junctions and/or the test strip conductor so that quantitative statements on corresponding structural elements in the actual solid integrated circuit can be made therewith. I.e. the reliability of the function of the strip conductors of the metallization system with thick metal leads and their pads for the electric connection with conductor strips of the metallization system with a small metal thickness can be examined in an efficient and statistically relevant manner so that quantitative statements on the specification of the solid integrated circuit are also possible. Thus, the test structure according to the invention makes the testing of the thick metal leads in connection with the connection points of the vertical junctions possible, which are connected thereto. If needed, the connection points of the vertical junctions can be monitored by corresponding suitable conventional test structures.

In a further advantageous development the first current lead and the second current lead have in each case a metal area which is tapered to the width of the test strip conductor. Thanks to this measure, an efficient impressing of the high current across the metal areas which are formed in the thick metallization system is achieved, and, due to the tapering, correspondingly high current densities only occur in a small section of these metal areas so that there, as well, the probability of a current-induced migration of material is substantially lower as compared with the electric junctions and the test strip conductors, which are to be the actual subject matter of the testing.

Advantageously, the tapering metal area is a symmetrical area in order to reduce weak points in the lead, if necessary, and to also reduce the influence of possible grain boundaries in this area.

In a further advantageous embodiment the first and the second power lead have in each case an electric connection junction which establishes a connection to the first conductor piece and/or to the second conductor piece. Thus, the current initially impressed in the thick metallization system can be efficiently impressed into the metallization system that is located beneath it, and the electric connection junctions, if necessary, can be designed in such a way that there the probability of the occurrence of a current-induced effect of the migration of material is very small. The electric connection junctions could e.g. be produced with a larger diameter as compared with the electric junctions to be tested so that there the probability of a defect is relatively small. In other illustrative embodiments the electric connection junctions are structured in the same way as the electric junctions so that these connection junctions may already also serve as test areas, whereby the number of the electric junctions taken into consideration in the test is altogether higher, in order to thus obtain a statistically higher relevance.

In a further embodiment, the electric connection junctions are respectively directly connected to the first and second connecting islands. A very space-saving and efficient structure for the feeding of the high current into the thin metallization system can be achieved with this design, since this very surface of the connecting island is used for the feeding of the current into the thin metallization system without further lateral components. Here, the corresponding electric connection junctions can again be designed in such a way that there is a very small probability for the occurrence of electromigration effects so that the test substantially relates to the electric junctions and the test strip conductor, whereas in other examples the electric connection junctions may be produced in accordance with similar or the same design rules as the further electric junctions so that the total number of the junctions to be tested is larger.

In a further advantageous embodiment the electric connection junctions are accordingly connected to the respective tapering metal area. Thus, an efficient impressing of the high current into the electric connection junctions is achieved without there being a high probability of the occurrence of electromigration defects in the metal areas. If e.g. the conductor pieces to which the electric connection junctions are connected have a similar or the same configuration as actual structural elements in the thin metallization system, a configuration which is identical to the corresponding structural elements in the solid circuit results at least for the junction from the conductor piece to the electric connection junction so that therewith at least the electric connection junctions can contribute to a statement on electromigration defects.

In an advantageous embodiment the metal areas are continuously tapered. Due to the absence of abrupt changes in the width of the metal areas a substantially continuous increase in the current density also results without the occurrence of corresponding discontinuities, which, otherwise, could give rise to preferred defect areas during the electromigration test. Thus, a continuous adaptation of the width of the metal area to the actually desired design width is achieved by the continuous tapering, and, in an illustrative embodiment, the metal areas are tapered to a width corresponding to the width of the test strip conductor. Thus, the corresponding electric connection junction can be produced under similar or almost identical conditions as they are also present in an actual integrated circuit or as they prevail for the electric junctions that are connected to the test strip conductor, if the same or similar geometrical dimensions for the electric connection junctions and the electric junctions are desired.

In a further illustrative embodiment the first and the second power lead have two or several electric connection junctions. In this fashion, the current density in the individual electric connection junctions can be reduced, if the probability of the occurrence of a current-induced migration of material in these electric connection junctions is to be kept small. In this fashion an occurrence of electromigration defects is substantially restricted to the electric junctions and the test strip conductor connected thereto.

In a further advantageous embodiment the first and the second conductor pieces have in each case two or more conductor areas and an opening area, through which the two or more conductor areas are connected to each other. An improved flexibility in the design of the conductor pieces taking the respective design rules into consideration results due to this design, since the length can e.g. be enlarged, if required, for a desired width of the conductor pieces and/or conductor areas, by just providing two or more conductor areas with the desired design width. Here, the opening area can also have a corresponding width in an illustrative embodiment so that the electric junction ending there finds the same conditions as in the actual structural elements, however, without there being an increased probability for the occurrence of electromigration defects in the conductor areas connected thereto and also in the opening area.

In a further advantageous embodiment the test structure is symmetrically designed with respect to the center of the test conductor strip. More extensive statements can be made in view of electromigration defects in this fashion, since, due to the reversal of the direction of current due to the symmetric arrangement, the defects should also be reversed in their position with respect to the center of the conductor strip. Relevant statements on the respective migration mechanisms can be obtained in this connection with a high degree of significance in the case of a corresponding different behavior due to the symmetry of the test structure.

In a further advantageous embodiment the test structure moreover comprises a monitoring device for recognizing a change in at least the test strip conductor, which is caused by the migration of material. Thus, it is possible to make further quantitative statements on migration effects so that an extensive statement on the behavior of the respective metallization systems can be obtained in interaction with the information on the change in resistance.

In one embodiment the monitoring device comprises an extrusion monitor. The extrusion monitor permits a detection of a deflection of the test strip conductor, e.g. by monitoring a voltage applied to the extrusion monitor.

In a further embodiment a voltage tap is provided for the local determination of a change in resistance in the test conductor strip and/or the first and/or the second electric junction and/or one or both connection junction(s). Thus, it is possible due to this voltage tap to localize a defect caused by electromigration in an exact fashion, there being the possibility in particular in a suitable spatial division of the voltage taps to separately ascertain defects in the area of electric junctions and the test conductor strip.

In a further embodiment the length of the first and the second conductor piece is smaller than the Blech length (also referred to herein as the sheet length) for the specified current density and the metal material of the thin metallization system.

In further advantageous embodiments the width of the first and the second conductor pieces corresponds to a design width of metal leads in the solid state integrated circuit at least in an area of contact with the appertaining first and/or second electric junction. "Authentic" conditions are created in the test structure in view of the electric junctions in this fashion so that, on the one hand, the respective material properties at the junction area are identical to those of the actual components and, on the other hand, the used production processes result in identical metal structures in the conductor pieces. Thus, the corresponding determination of the sheet lengths for the conductor pieces is substantially equivalent to the actual structural elements in the integrated solid state circuit.

In a further illustrative embodiment the distance of an electric connection junction that contacts the first conductor piece to the first electric junction is determined in accordance with a minimum design distance in the solid integrated circuit. The "most critical" conditions for respective junctions in the solid circuit are also replicated in the test structure in this fashion so that the measuring results obtained therefrom make a suitable specification possible since the electromigration test simulates the most critical conditions, since, typically, a minimum distance both in the production of the electric junctions and in their operation gives rise to increased electromigration defects.

In a further aspect the object is attained by a test structure which is described in claim 18. A symmetric structure is implemented in this test structure and the introduction of current into the thin metallization system is achieved by means of tapering metal areas in the thick metallization system and corresponding vertical junctions. Moreover, the conductor pieces have a length that is smaller than the corresponding sheet length so that current-induced effects of the migration of material are substantially restricted to the vertical junctions and the test conductor strip.

According to a further aspect the object is attained by a process for the production of a test structure. The test structure serves for a highly accelerated electromigration test for the specification of an integrated circuit with a thick metallization system which is formed over a thin metallization system, the metal thickness of the thick metallization system corresponding to at least double the metal thickness of the thin metallization system. The process comprises the step of the determination of the sheet length for conductor pieces of the thin metallization system for a desired design width of the conductor pieces and for a predetermined test current density for a test conductor strip in the thick metallization system.

Moreover, the process comprises the step of ascertaining a minimum design distance of two vertical electric junctions which establish connections between the thin metallization system and the thick metallization system. Also, the test conductor strip and the conductor pieces are produced in accordance with the ascertained sheet length and electric junctions for contacting the conductor pieces with connecting islands observing the ascertained minimum design distance, if the ascertained sheet length is larger than the ascertained minimum design distance.

It is ensured by the process that the electric junctions in the test structure are produced observing the minimum design distance and the required sheet length so that, on the one hand, a migration of material in the conductor pieces is avoided, and, on the other hand, the desired critical distances occurring in the integrated circuit are replicated in the test structure. The minimum design distance can e.g. be ascertained from requirements regarding a low packing density and the electric behavior. Then, suitable lengths can be determined for a (predetermined) desired minimum distance, if they are compatible with the technological prerequisites. If required, other minimum distances can then be ascertained on the basis of test structures taking the operating behavior into consideration, for the thin metal system, e.g. on the basis of conventional test structures, the structure according to the invention can be used for the thick metal system.

In an advantageous embodiment the process also comprises: providing at least two conductor piece branches for reducing the amperage in each conductor piece branch and ascertaining an updated sheet length for the conductor piece branches, if the ascertained sheet length is smaller than the minimum design distance.

Thus it is achieved that the minimum design distance can also be observed, if the sheet length initially ascertained is smaller than this distance since, due to the division into two or more branches, a reduction of the current density is achieved and the sheet length for the respective branch becomes larger due to this. The two or more branches can in particular be produced taking the design rules for the thin metallization system into consideration so that identical conditions for each branch can also be achieved. A corresponding junction for contacting the connecting island may be provided for each branch or a common transition may be provided depending upon the fact whether these junctions are already to be "components" of the structural elements to be actually tested.

Further advantageous embodiments are indicated in the claims and in the following specification that is rich in details.

BRIEF DESCRIPTION OF THE DRAWINGS

The invention is now explained in greater detail by means of examples and with the aid of the drawings, in which:

FIG. 4b shows a sectional view of the schematic representation of the test structure in FIG. 4a.

DETAILED DESCRIPTION OF THE INVENTION

Figure 1A:
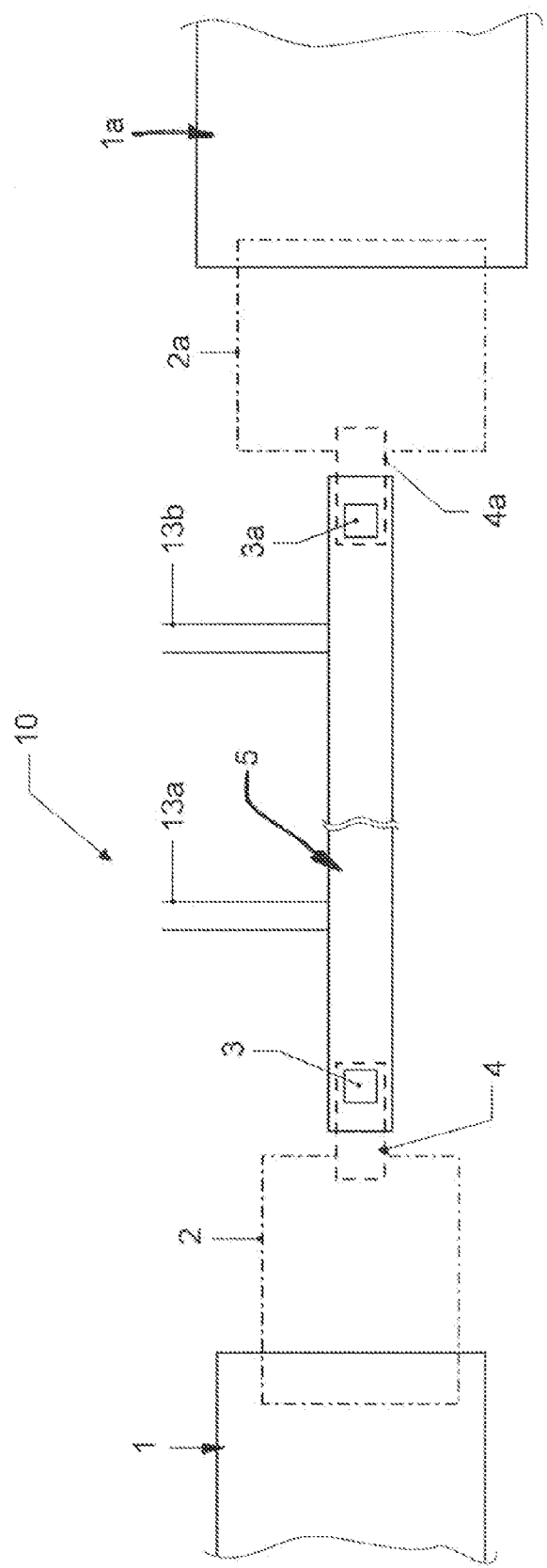
FIG. 1a shows a top view of a schematic representation of a test structure for an accelerated migration test according to an embodiment of the invention.

FIG. 1a shows a top view of a test structure 10 with a first connecting island, e.g. in the form of a bond island 1 and a second connecting island 1a. A first power lead 2 and a second power lead 2a are respectively connected to the first connecting island 1 and the second connecting island 1a and they are also connected to a first and a second conductor piece 4 or 4a, respectively. A first electric junction 3 (in particular a via) and a second electric junction 3a are provided which establish a connection between the conductor piece 4 or 4a, respectively, and a test strip conductor 5.

Moreover, a monitoring device in the form of two voltage taps 13a, 13b is shown which make a detection of a change in resistance possible with a desired local resolution in accordance with the location of the voltage taps 13a, 13b.

Figure 1B:
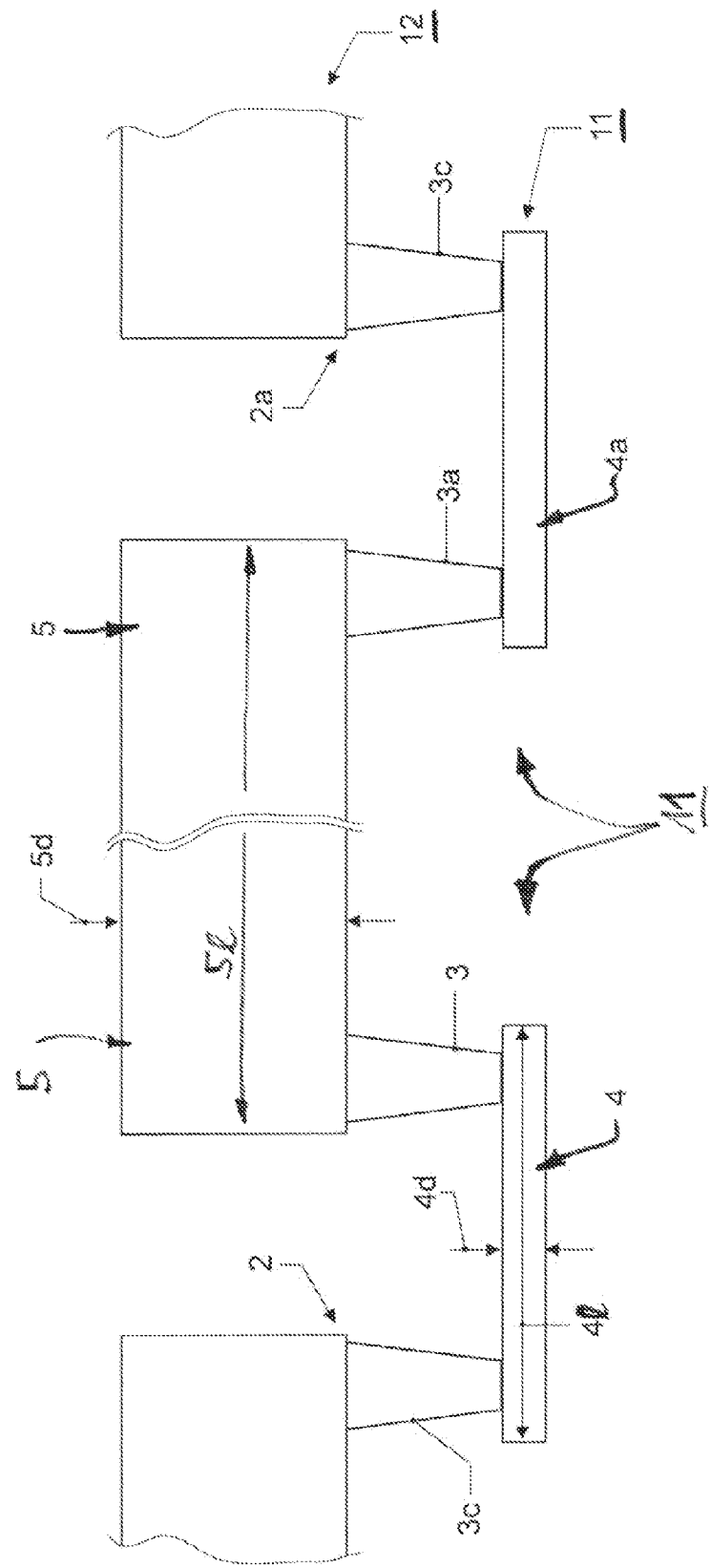
FIG. 1b shows a vertical sectional view of the schematic representation of a test structure for an accelerated migration test according to another embodiment of the invention.

FIG. 1b shows a schematic sectional view of the test structure 10 of FIG. 1a. As shown, the test structure 10 is produced with a total metallization system which comprises a thin metallization system 11 and a thick metallization system 12.

The test conductor strip is produced in the thick metallization system 12 and has a thickness 5d which corresponds to the thickness of structural metal elements in the metallization system 12 in component areas (not shown), if the test structure is still present in the wafer composite with the actual integrated circuits whose electromigration behavior must be tested.

The thickness 5d may e.g. be approx. 800 nm to 5000 nm or more.

As already mentioned, relatively high amperages occur in many modern integrated circuits (solid state circuits, also referred to herein as "solid circuits") during operation, due to which complex metal systems are required, a junction from one metal system with relatively little thickness to a metal system with relatively large thickness frequently occurring, since very different amperages must be coped with in the individual metal systems or because there are very different requirements regarding the resistance for achieving a high operating speed of the integrated circuit. Thus, the integrated circuit may represent an optional form of an integrated circuit, in which the requirements regarding a high speed and/or high amperages require the providing of very different metal thicknesses in adjacent metal systems at least in certain wiring planes. For instance, many integrated circuits not only contain a complex control circuit in digital and/or analog form which may also include memory areas, but also contain power areas, which are connected with the control circuit and can process high voltages and/or currents. A metallization is often provided in these cases which is adapted to the different amperages and has a corresponding design in the previously indicated fashion.

Examples of circuits for a mixed arrangement of control circuits and power stages include integrated circuits for clocked power supplies, motor controls, controllers with integrated power stage and DSP circuits with integrated output stages. Microprocessors may also have very different wiring planes or may be provided with corresponding "peripheral" components on the same chip so that increased requirements regarding the amperages may result in the individual metal planes. For the sake of simplicity the integrated circuit is not represented in the drawings, it having to be observed that the test structure (its components) are produced on the basis of the same or at least very similar design rules on the same substrate (not shown) in order to thus obtain a very "authentic" behavior of the test structure 10 as compared with the components of the corresponding structural elements of the integrated circuit.

The components of the metal systems of the integrated circuit are formed in the same metal system as the components of the test structure 10 only in different areas (or planes) of the corresponding substrate so that these components of the test structure 10 are accessible to a measurement even if the many integrated circuits that are typically contained in an individual substrate are not separated as yet. Moreover, the test structure may also represent a separate structure, e.g. after the separation of the individual chips, the test structure having previously been produced together with the metal systems of the integrated circuit chips. In other embodiments the test structure 10 may also be provided on special test wafers, but in this case, as well, the same design rules and production processes as for actual integrated circuits are being used at least for the considered metal systems.

On the other hand, the conductor pieces 4, 4a of FIG. 1b are produced in a thin metallization system 11 so that the thickness 4d of the conductor pieces 4, 4a corresponds to the metal thickness of the system in the actual component areas.

The thickness 5d is at least twice as large as the thickness 4d.

The conductor pieces 4, 4a are designed in such a way that the occurrence of the migration of material is avoided at a specified density of the test current for the test strip conductor. This is accomplished e.g. by fixing the length 41 to a length so that the sheet length for the conductor pieces 4, 4a is not exceeded. The sheet length designated the length of a conductor as of which no migration of material occurs in the conductor at a given current density. The sheet length may be ascertained by measurement for a given conductor type, i.e. the type of the material whose crystal structure is ascertained by means of a measurement, by determining the change in resistance for similar conductor sections and different amperages. Optional other processes may also be used. On the other hand, a length 5l of the test strip conductor 5 is selected so that its sheet length is clearly exceeded.

Typical length values for the length 5l are 400 μm to 1000 μm.

In FIG. 1b the current supply structures 2, 2a are provided in the form of electric connection junctions 3c which are directly connected to the respective connecting island 1, 1a. Here, the connection junctions 3c may have a similar or identical structure as compared with the junctions 3, 3a, or the junctions 3c may be dimensioned larger in order to reduce the current density. The junctions 3c may e.g. have a larger dimension in one or both lateral direction(s) as compared with the junctions 3, 3a.

Figure 2:
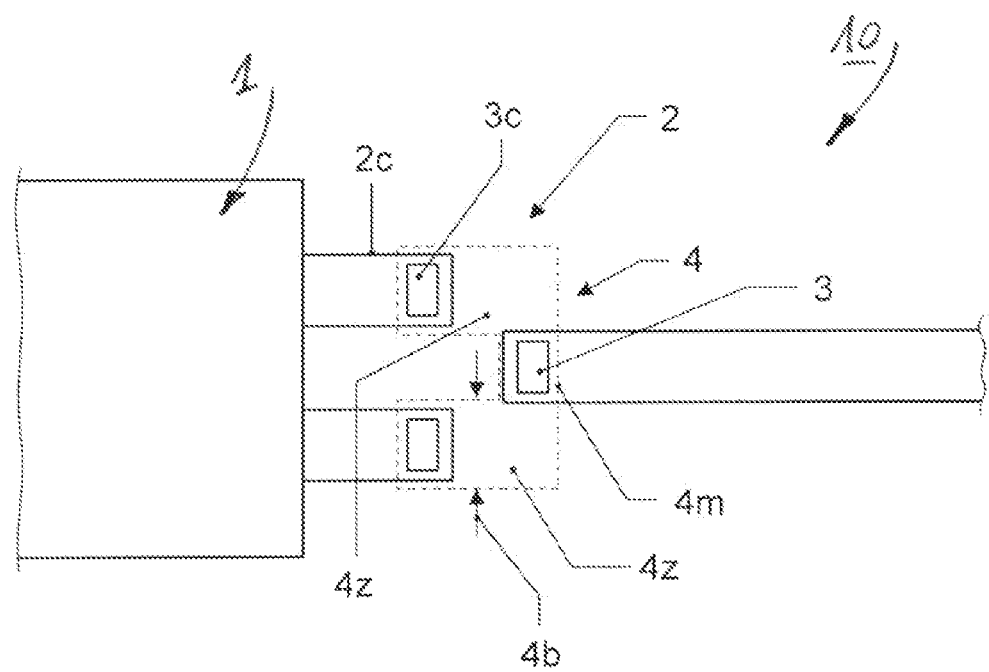
FIG. 2 shows a top view of a schematic representation of a test structure for an accelerated migration test according to a further embodiment with two conductor piece branches.

FIG. 2 shows a top view of one half of the test structure 10 according to a further embodiment, in which the current lead 2 comprises two or more metal areas 2c which are connected to the conductor piece 4 by corresponding junctions 3c.

The conductor piece 4 has two conductor branches 4z in the shown example, which converge in an opening area 4m, which, in turn is contacted by the electric junction 3. Due to the division of the conductor piece 4 into two or more branches 4z a reduced current density results so that the associated sheet length becomes larger and, thus, more freedom of design for the designing of the power lead 2 is achieved. If a desired design width 4b for the conductor piece 4 is to be e.g. observed, which results in a too small sheet length for the specified test current density for the test strip conductor, a larger sheet length can be obtained due to the division into the branches 4z. An extrusion monitor can be additionally present (as described below), even if it is not drawn here.

Thus, a desired width for the thin conductor pieces 4, 4a can initially be determined in accordance with the design rules in the production of the test structure. Moreover, a desired minimum distance can be ascertained between adjacent junctions such as the junctions 3c and 3 in FIG. 1b. If the associated sheet length is too small, the branches 4z are provided, which are also to have the desired design width, and the new larger sheet length for the lower current density is ascertained in the branches so that the desired minimum distance can be implemented between the adjacent junctions.

In this connection design rules must be understood as fixed measurements or measurement ratios for the components of integrated circuits. This applies mainly to widths and distances of strip conductors and the junctions of the strip conductors in the case of metallizations. There is this "design rules" regulation for each process for the production of integrated circuits. This is the decisive regulation for a process for semi-conductors together with the process specification.

There are general instructions for the determination of the design rules for new processes, which observe the specific physical characteristics of the material and the process-related properties. Thus, a minimum distance according to design rules indicates a desired distance for components of a technology determined by the respective design rules.

Figure 3:
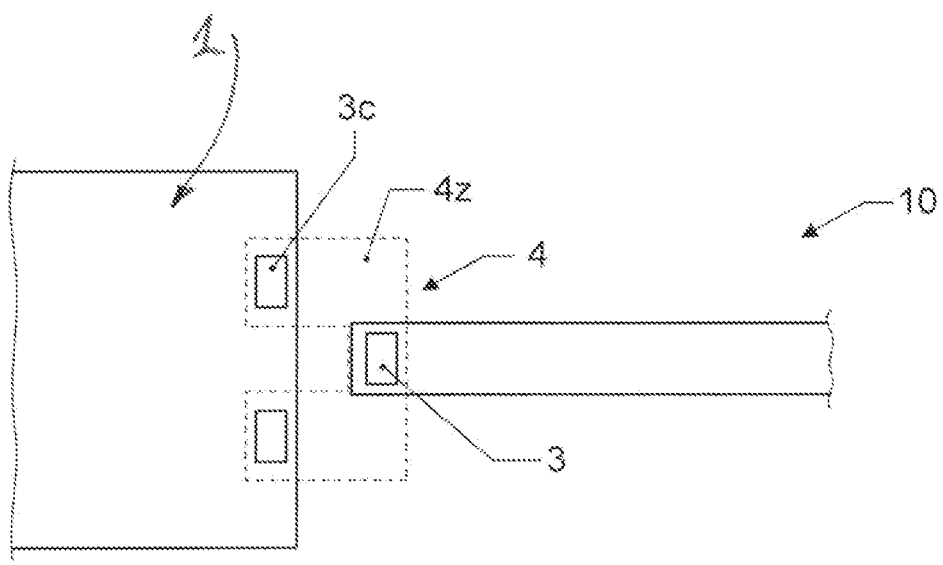
FIG. 3 shows a top view of a schematic representation of a test structure for an accelerated migration test according to a further embodiment with two conductor piece branches and vertical junctions directly connected to the connecting islands.

FIG. 3 shows a top view of the structure 10 of FIG. 2, where the connection junctions 3c are directly connected to the connecting island 1 in a modified fashion so that a space-saving configuration results for the current lead 2.

Figure 4A:
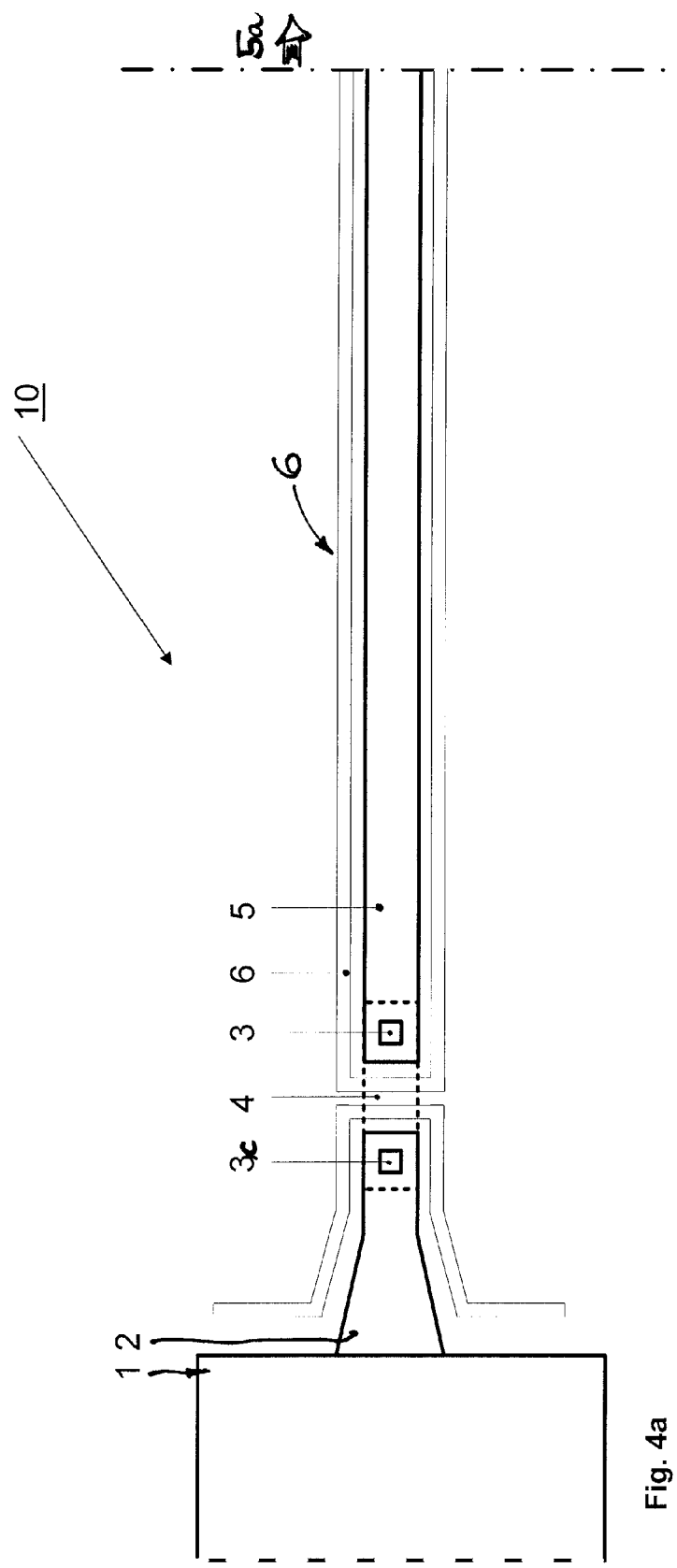
FIG. 4a shows a top view of a schematic representation of a test structure for an accelerated migration test according to an advantageous embodiment with tapering current supply areas in the thick metallization system.

FIG. 4a shows a top view of a further preferred embodiment of the test structure 10.

Here, as well, the bond island 1 serves for the supply of current. The current flows via the power lead which is provided as a thick metal conductor piece 2 which is tapered up to the test strip width of the thick metal strip conductors, i.e. the test strip conductor 5 and leads into the thick metal conductor piece 5 to be tested via a vertical connection junction 3c from the thick metal conductor piece 2 to the short thin metal strip conductor 4 and via a junction 3. The current flows through a similar arrangement at the other end 5a of the thick metal conductor piece 5 and the bond island on the other side (not shown) in a reverse order so that a symmetrical structure is obtained therewith, which may also be operated in the reversed direction of current.

The thick metal conductor piece 2 has a continuous tapering in the shown preferred embodiment. This is optional.

Preferably, the arrangement is surrounded by a control strip conductor 6 as a variant of a monitoring device, a so-called "extrusion monitor" which allows the electric recording of migration-related deflections of the thick metal conductor piece 5 during the test and makes a better dissipation of the occurring heat loss possible so that temperature gradients are reduced, if an influence by temperature gradients on the measurement is not desired.

It should be observed that a corresponding extrusion monitor 6 may also be provided in the other previously shown embodiments. The extrusion monitor may be provided around the conductor pieces of the power lead 2 in the structure of FIG. 2 and around the test strip conductor 5. In a similar fashion, the control strip conductors 6 may also be provided on the power lead 2 and the test strip conductor 5 of the embodiment of FIG. 3, if required, as this is represented in an analogous fashion in FIG. 4a.

Figure 4B:
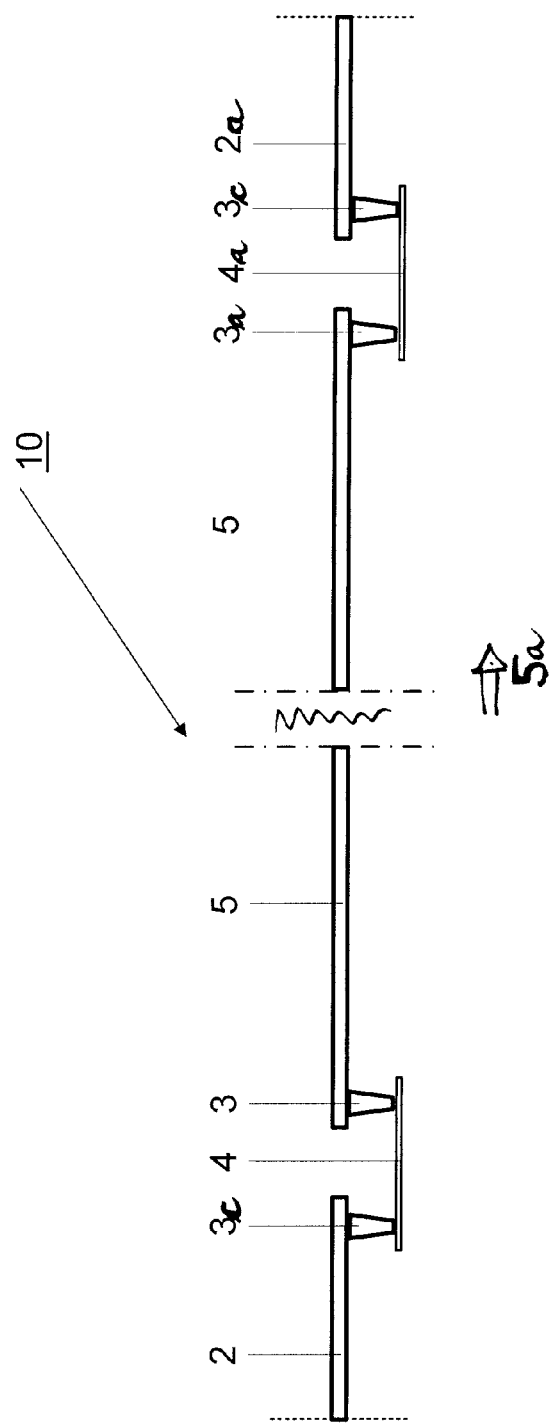

FIG. 4b shows a vertical sectional view of the embodiment represented in FIG. 4a with the individual vertical junctions 3c, 3, 3a, 3c.

REFERENCE NUMERALS (The Same Designations for the Same Elements in Different Figs.)
1, 1a: bond island and/or connecting island
2, 2a: power lead made of thick metal
3, 3a: vertical junctions between thin and thick metal strip conductors ("vias")
3c: vertical junctions for the contacting of the connecting islands (directly or via the thick metal conductor piece)
4, 4a: lower conductor piece made of thin metal
4z, 4m: branches of the lower conductor piece made of thin metal
4d, 4b, 4l: thickness, width and/or length of the conductor pieces 4, 4a
5: test strip conductor made of thick metal
5d: thickness of the thick metal
6: control strip conductor, so-called "extrusion monitor"
10: test structure
11: thin metallization system
12: thick metallization system
13a, 13b: voltage taps

The invention claimed is:

1. A test structure for an accelerated electromigration test for thick metal strip conductors and for electric junctions between a thin metallization system (11) of a solid state integrated circuit and a thicker metallization system (12) of the solid state integrated circuit, both of which are disposed on the solid state integrated circuit, the metal thickness in the thicker metallization system being at least twice the metal thickness in the thin metallization system, the test structure comprising:
   a first connecting island (1) and a second connecting island (1a) formed in the thicker metallization system;
   a first conductor piece and a second conductor piece (4, 4a) formed in the thin metallization system (11);
   a first power lead (2) for connecting the first connecting island (1) with the first conductor piece (4);
   a second power lead (2a) for connecting the second connecting island (1a) with the second conductor piece (4a);
   a test strip conductor (5) formed in the thicker metallization system (12);
   a first electric junction (3) for connecting the first conductor piece (4) with the test strip conductor (5) and a second electric junction (3a) for connecting the second conductor piece (4a) with the test strip conductor (5); and
   wherein the lengths of the first and the second conductor pieces (4, 4a) are dimensioned to substantially avoid electromigration of material from the first and the second conductor pieces caused by current for a specified current density to test the first and second electric junctions (3, 3a) and the test strip conductor (5).

2. The test structure according to claim 1, wherein each of the first power lead and the second power lead comprises a metal area tapered to the width of the test strip conductor.

3. The test structure according to claim 1, wherein each of the first power lead and the second power lead comprises an electric connection junction which establishes a connection to at least one of the first conductor piece and the second conductor piece.

4. The test structure according to claim 1, wherein the first and second electric connection junctions are each directly connected to at least one of the first and second connecting island.

5. The test structure according to claim 2, wherein the first and second electric connection junctions are connected to a respective tapering metal area.

6. The test structure according to claim 2, wherein the metal areas are continuously tapered.

7. The test structure according to claim 1, wherein the first power lead and the second power lead have two or more electric connection junctions.

8. The test structure according to claim 1, wherein each of the first conductor piece and the second conductor piece has at least two conductor areas and an opening area, wherein the at least two conductor areas are connected to each other.

9. The test structure according claim 1, wherein the test structure is symmetrical with respect to a center of the test strip conductor.

10. The test structure according to claim 1, further comprising a monitoring device for detecting a change in at least the test strip conductor caused by a migration of material.

11. The test structure according to claim 10, wherein the monitoring device comprises an extrusion monitor.

12. The test structure according to claim 10, further comprising a voltage tap for a local determination of a change in resistance in at least one of the test strip conductor, the first electric junction, and the second electric junction.

13. The test structure according to claim 1, wherein the lengths of the first conductor piece and the second conductor piece are smaller than the Blech length for the specified current density and the metal material of the thin metallization system.

14. The test structure according to claim 1, wherein widths of the first conductor piece and the second conductor piece each correspond to a width of metal leads in the solid state integrated circuit at least in an area of contact with the respective first and second electric junctions.

15. The test structure according to claim 3, wherein a distance of the electric connection junction which contacts the first conductor piece and the first electric junction corresponds to a minimum design distance in the solid state integrated circuit.

16. The test structure according to claim 1, wherein the test strip conductor has a length in the range of 400 µm to 1000 µm.

17. The test structure according to claim 3, wherein each electric connection junction comprises two electric connection junctions and the first and second electric junctions each comprise two electric junctions.

18. A test structure for an electromigration test for thick metal strip conductors and for electric junctions between thin and thick metallization systems of solid state integrated circuits, comprising:
   two bond islands (1);
   two power leads (2);
   two conductor pieces of thin metal (4);
   two conductor pieces of thick metal (2);
   four vertical junctions (3) located between the two conductor pieces of thin metal (4) and the two conductor pieces of thick metal (2);

a test strip conductor (5) of thick metal and a control conductor strip that permit the electric recording of migration-related deflections of the test strip conductor (5) during a corresponding electromigration test;

wherein the conductor pieces of thin metal and the conductor pieces of thick metal are symmetrically arranged with respect to a center of the test strip conductor (5); and the power leads (2) comprise thick metal and are tapered to a width of the test strip conductor (5) and the conductor pieces of thin metal (4) have a length which is smaller than the Blech length of the conductor pieces of thin metal for counter-acting migration-related stress and preventing failure in the conductor pieces of thin metal.

19. The test structure according to claim 18, wherein distances of the vertical junctions (3) correspond to minimum design rules for the solid state integrated circuits.

20. The test structure according to claim 18, wherein a length of the test strip conductor (5) is from 400 µm to 1000 µm.

21. A process for producing a test structure for an electromigration test for an integrated circuit with a thick metallization system which is formed over a thin metallization system, wherein a metal thickness of the thick metallization system corresponds to at least twice a metal thickness of the thin metallization system, the process comprising:

determining the Blech length for conductor pieces to be formed in the thin metallization system for a desired design width of the conductor pieces and for a predetermined test current density for a test strip conductor to be formed in the thick metallization system;

ascertaining a minimum design distance of two electric vertical junctions, which establish connections between the thin metallization system and the thick metallization system; and producing the test strip conductor and the conductor pieces in accordance with the determined Blech length and producing electric junctions for contacting the conductor pieces and the connecting islands observing the ascertained minimum design distance, if the determined Blech length is larger than the ascertained minimum design distance.

22. The process according to claim 21, further comprising:

providing at least two conductor piece branches for reducing amperages in each conductor piece branch; and determining an updated Blech length for the conductor piece branches, if the determined Blech length is smaller than the minimum design distance.

23. A test structure for an accelerated electromigration test for thick metal strip conductors and for electric junctions between a thin metallization system of a solid state integrated circuit and a thicker metallization system of the solid state integrated circuit, both of which are disposed on the solid state integrated circuit, the metal thickness in the thicker metallization system being at least twice the metal thickness in the thin metallization system, the test structure comprising:

a first connecting island and a second connecting island formed in the thicker metallization system;

a first conductor piece and a second conductor piece formed in the thin metallization system;

a first power lead for connecting the first connecting island with the first conductor piece;

a second power lead for connecting the second connecting island with the second conductor piece;

a test strip conductor formed in the thicker metallization system;

a first electric junction connecting the first conductor piece with the test strip conductor and a second electric junction connecting the second conductor piece with the test strip conductor; and wherein at least the lengths of the first and the second conductor pieces are dimensioned to substantially avoid electromigration of material from the first and the second conductor pieces caused by current for a specified current density to test the first and second electric junctions and the test strip conductor.

* * * * *